US011545492B2

(12) United States Patent
Ramaswamy

(10) Patent No.: US 11,545,492 B2
(45) Date of Patent: Jan. 3, 2023

(54) TRANSISTORS, ARRAYS OF TRANSISTORS, ARRAYS OF MEMORY CELLS INDIVIDUALLY COMPRISING A CAPACITOR AND AN ELEVATIONALLY-EXTENDING TRANSISTOR, AND METHODS OF FORMING AN ARRAY OF TRANSISTORS

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 17/171,827

(22) Filed: Feb. 9, 2021

(65) Prior Publication Data
US 2021/0183864 A1 Jun. 17, 2021

Related U.S. Application Data

(62) Division of application No. 16/438,106, filed on Jun. 11, 2019, now Pat. No. 11,145,656, which is a (Continued)

(51) Int. Cl.
*H01L 27/108* (2006.01)
*H01L 49/02* (2006.01)
(Continued)

(52) U.S. Cl.
CPC .... *H01L 27/10814* (2013.01); *H01L 23/5283* (2013.01); *H01L 27/10852* (2013.01); (Continued)

(58) Field of Classification Search
CPC .......... H01L 29/7827; H01L 29/66666; H01L 29/78642
See application file for complete search history.

(56) References Cited

U.S. PATENT DOCUMENTS 6,573,613 B2 6/2003 Arimoto et al.
8,610,202 B2 * 12/2013 Masuoka ........ H01L 21/823885
257/329
(Continued)

FOREIGN PATENT DOCUMENTS

EP 19793070 4/2021
JP 06-125058 5/1994
(Continued)

*Primary Examiner* — Stephen M Bradley
(74) *Attorney, Agent, or Firm* — Wells St. John P.S.

(57) ABSTRACT

A transistor comprises semiconductor material that is generally L-shaped or generally mirror L-shaped in at least one straight-line vertical cross-section thereby having an elevationally-extending stem and a base extending horizontally from a lateral side of the stem above a bottom of the stem. The semiconductor material of the stem comprises an upper source/drain region and a channel region there-below. The transistor comprises at least one of (a) and (b), where (a): the semiconductor material of the stem comprises a lower source/drain region below the channel region, and (b): the semiconductor material of the base comprises a lower source/drain region. A gate is operatively laterally adjacent the channel region of the stem. Other embodiments are disclosed, including arrays of memory cells individually comprising a capacitor and an elevationally-extending transistor. Methods are disclosed.

20 Claims, 16 Drawing Sheets

Related U.S. Application Data division of application No. 15/965,632, filed on Apr. 27, 2018, now Pat. No. 10,388,658.

(51) Int. Cl.
    *H01L 29/78*     (2006.01)
    *H01L 29/10*     (2006.01)
    *H01L 23/528*     (2006.01)

(52) U.S. Cl.
    CPC .. *H01L 27/10873* (2013.01); *H01L 27/10891* (2013.01); *H01L 28/90* (2013.01); *H01L 29/1095* (2013.01); *H01L 29/7827* (2013.01)

(56) References Cited

U.S. PATENT DOCUMENTS

| | | |
|---|---|---|
| 9,246,093 B2 | 1/2016 | Zanderighi et al. |
| 9,431,400 B2 | 8/2016 | Takemura |
| 10,276,230 B2 | 4/2019 | Kawamura et al. |
| 2012/0112270 A1 | 5/2012 | Park et al. |
| 2012/0126301 A1 | 5/2012 | Kunkel et al. |
| 2016/0093611 A1* | 3/2016 | Cheng ............... H01L 29/78642 257/329 |

FOREIGN PATENT DOCUMENTS

| | | | |
|---|---|---|---|
| JP | 06-077432 | 6/1994 | |
| JP | 2003-030999 | 1/2003 | |
| JP | 2011-014909 | 1/2011 | |
| JP | 2012-182446 | 9/2012 | |
| KR | 2012-0069258 | 6/2012 | |
| TW | I413225 | 10/2013 | |
| TW | 201347096 A | * 11/2013 | |
| TW | I443779 | 7/2014 | |
| TW | I479608 | 4/2015 | |
| TW | 109116372 | 1/2021 | |

\* cited by examiner

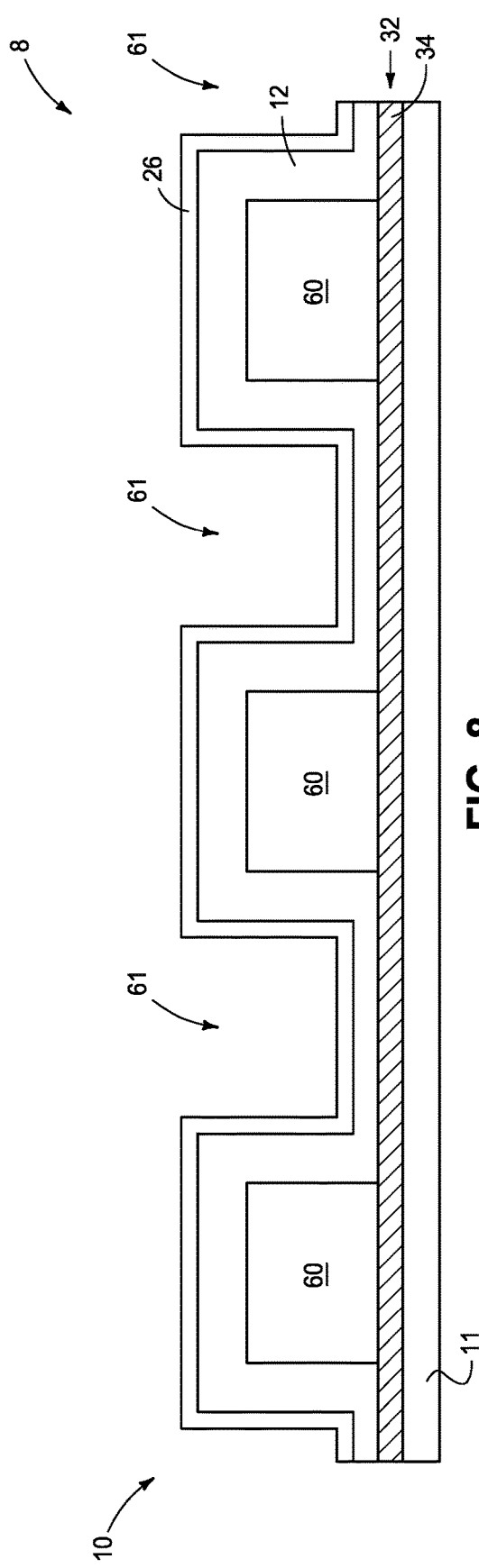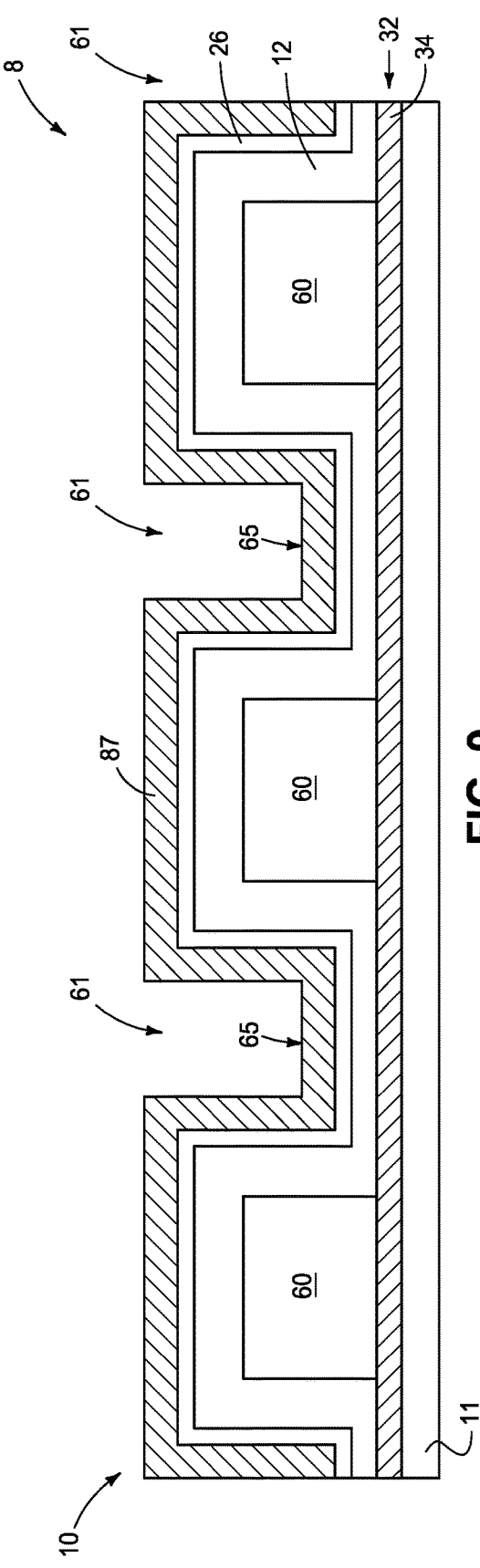

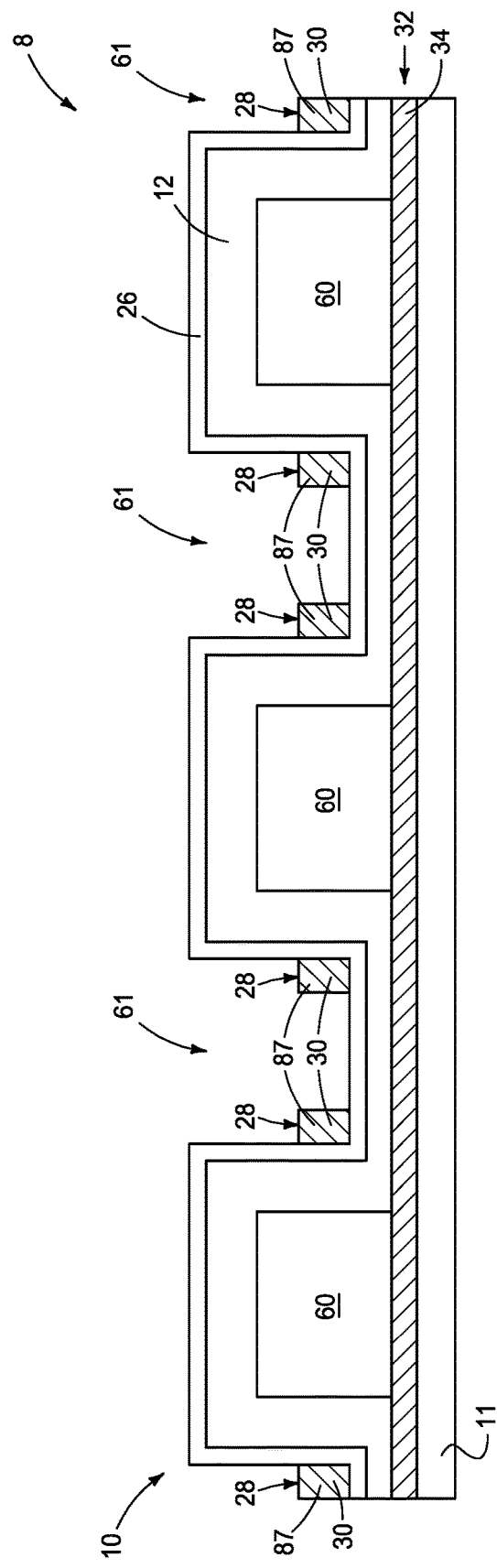
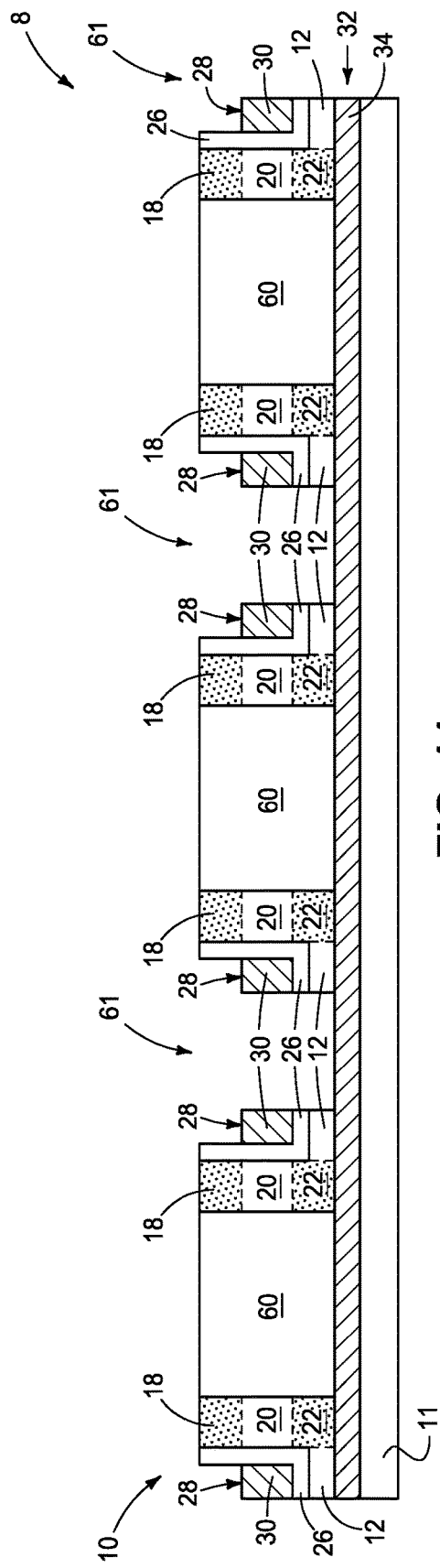
FIG. 10
FIG. 11

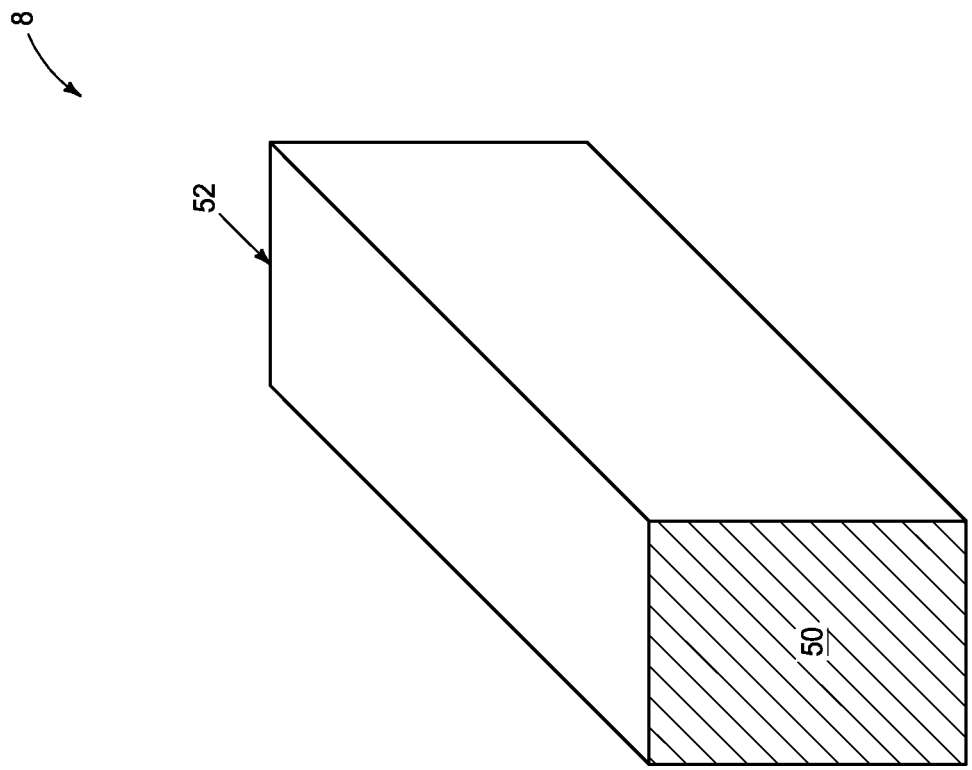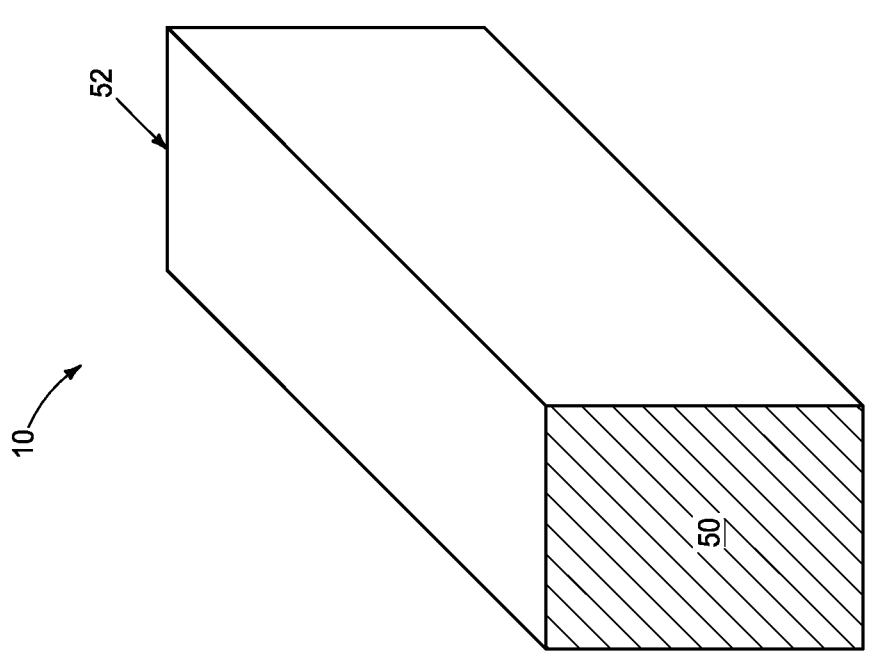
FIG. 15

US 11,545,492 B2

TRANSISTORS, ARRAYS OF TRANSISTORS, ARRAYS OF MEMORY CELLS INDIVIDUALLY COMPRISING A CAPACITOR AND AN ELEVATIONALLY-EXTENDING TRANSISTOR, AND METHODS OF FORMING AN ARRAY OF TRANSISTORS

RELATED PATENT DATA

This patent resulted from a divisional application of U.S. patent application Ser. No. 16/438,106, filed Jun. 11, 2019, entitled "Transistors, Arrays Of Transistors, Arrays Of Memory Cells Individually Comprising A Capacitor And An Elevationally-Extending Transistor, And Methods Of Forming An Array Of Transistors", naming Durai Vishak Nirmal Ramaswamy as inventor, which was a divisional of U.S. patent application Ser. No. 15/965,632, filed Apr. 27, 2018, entitled "Transistors, Arrays Of Transistors, Arrays Of Memory Cells Individually Comprising A Capacitor And An Elevationally-Extending Transistor, And Methods Of Forming An Array Of Transistors", naming Durai Vishak Nirmal Ramaswamy as inventor, now U.S. Pat. No. 10,388,658, the disclosures of which are incorporated by reference.

TECHNICAL FIELD

Embodiments disclosed herein pertain to transistors, to arrays of transistors, and to arrays of memory cells individually comprising a capacitor and an elevationally-extending transistor.

BACKGROUND

Memory is one type of integrated circuitry, and is used in computer systems for storing data. Memory may be fabricated in one or more arrays of individual memory cells. Memory cells may be written to, or read from, using digitlines (which may also be referred to as bit lines, data lines, sense lines, or data/sense lines) and wordlines (which may also be referred to as access lines). The digitlines may conductively interconnect memory cells along columns of the array, and the wordlines may conductively interconnect memory cells along rows of the array. Each memory cell may be uniquely addressed through the combination of a digitline and a wordline.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

BRIEF DESCRIPTION OF THE DRAWINGS

FIG. 8 is a view of the FIG. 6 construction at a processing step subsequent to that shown by FIG. 6.

FIG. 9 is a view of the FIG. 8 construction at a processing step subsequent to that shown by FIG. 8.

FIG. 10 is a view of the FIG. 9 construction at a processing step subsequent to that shown by FIG. 9.

FIG. 11 is a view of the FIG. 10 construction at a processing step subsequent to that shown by FIG. 10.

FIG. 15 is a view of the FIG. 14 construction at a processing step subsequent to that shown by FIG. 14.

DETAILED DESCRIPTION OF EXAMPLE EMBODIMENTS

Figure 1:
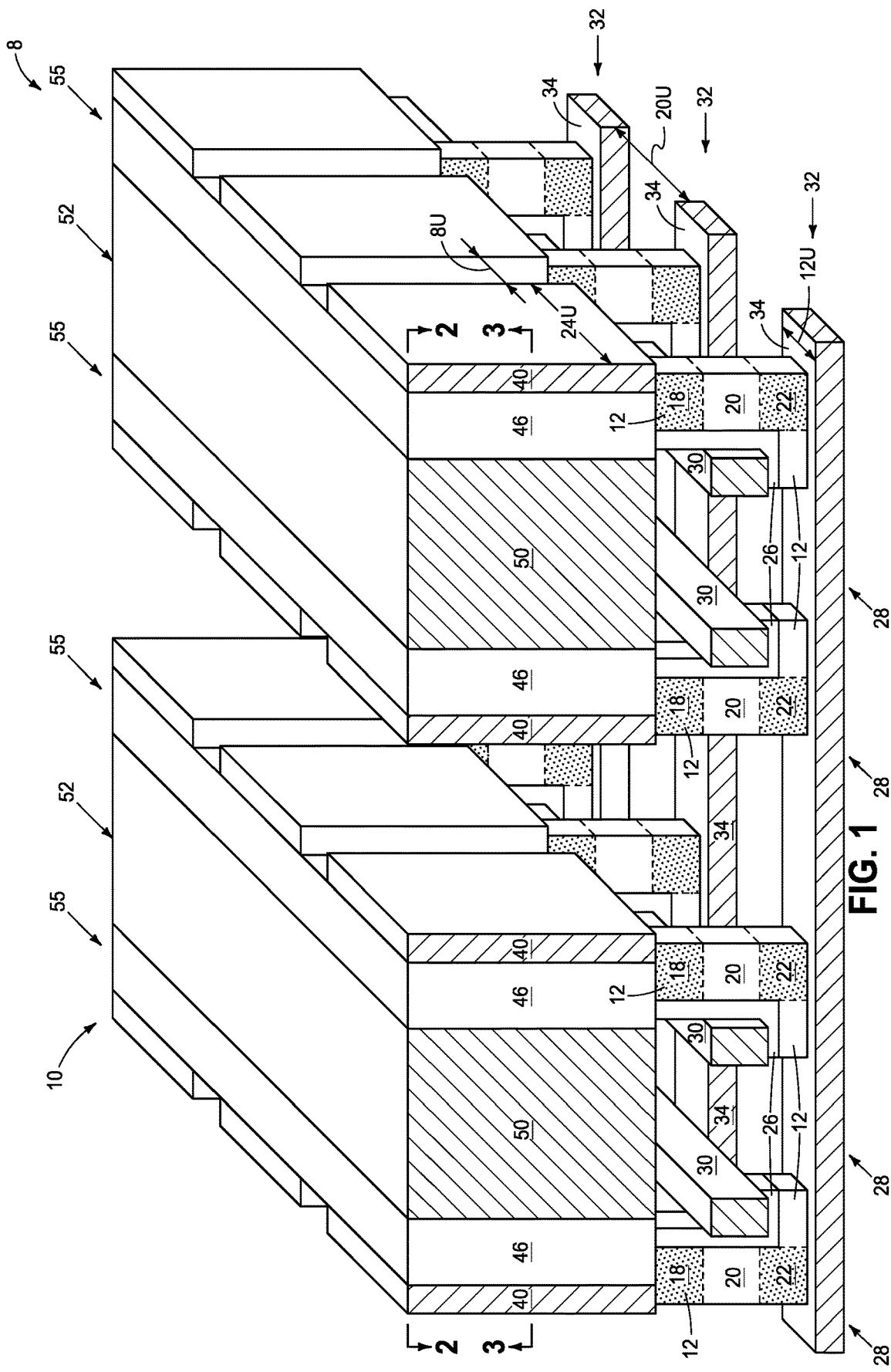
FIG. 1 is a diagrammatic perspective view of a substrate construction comprising an array of memory cells in accordance with an embodiment of the invention.

Embodiments of the invention encompass transistors, arrays of transistors, arrays of memory cells individually comprising a capacitor and an elevationally-extending transistor, and methods of forming an array of transistors. First example embodiments are initially described with reference to FIGS. 1-3 which show an example fragment of a substrate construction 8 comprising an array or array area 10 that has been fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated, and may or may not be wholly or partially within a memory array or sub-array. Further, multiple sub-arrays may also be fabricated and operated independently, in tandem, or otherwise relative one another. As used in this document, a "sub-array" may also be considered as an array. For better clarity of certain operative components, FIG. 1 does not show base substrate 11 and FIGS. 1 and 3 do not show surrounding dielectric isolating material. Array 10 comprises memory cells 85 individually comprising a capacitor 75 and an elevationally-extending transistor 25. In one embodiment, transistor 25 is vertical or within 10° of vertical.

Figure 2:
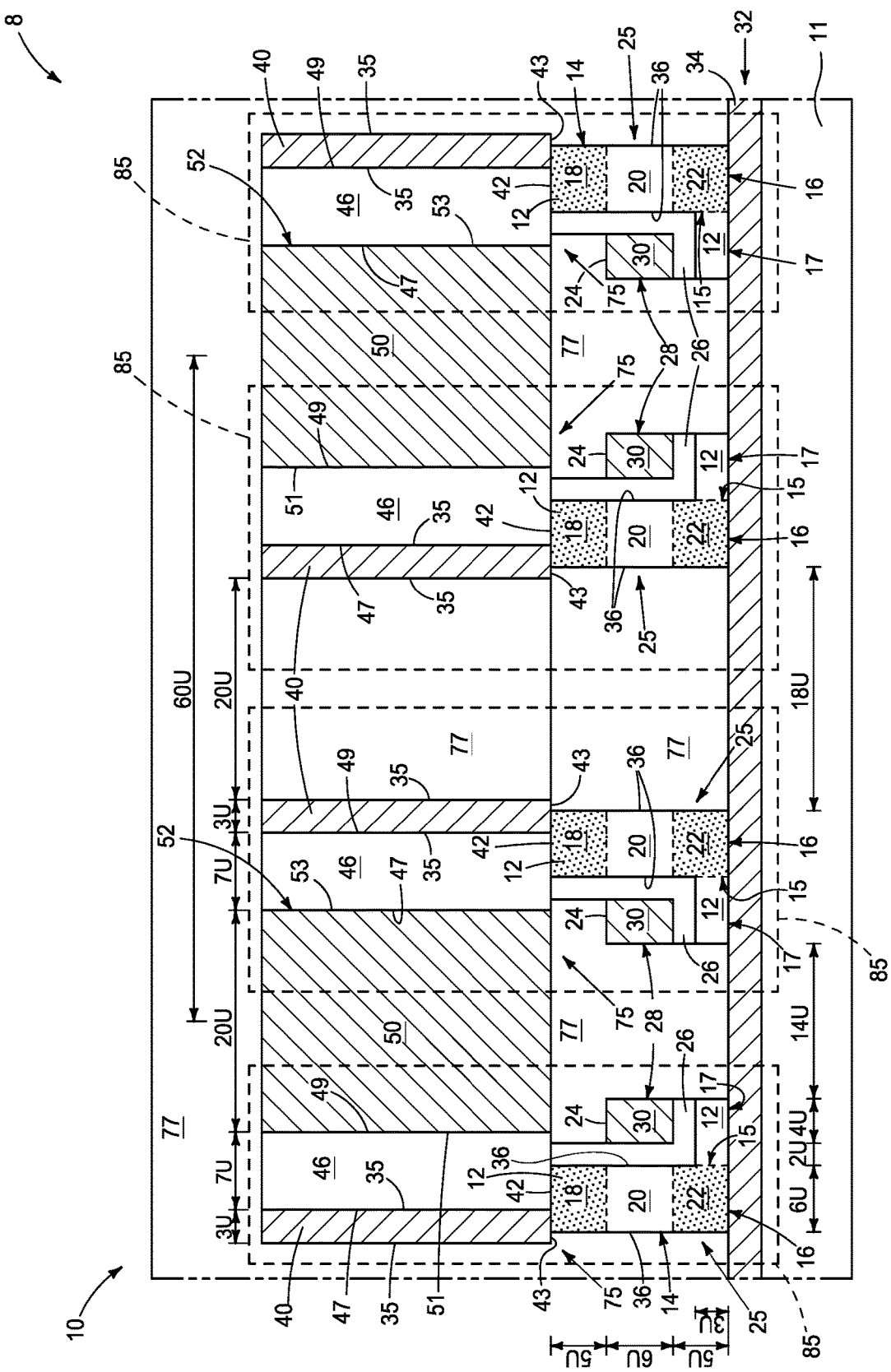
FIG. 2 is a diagrammatic front elevational view of the FIG. 1 construction, and is taken through line 2-2 in FIG. 1.

In one embodiment and as shown, transistors 25 individually comprise semiconductor material 12 (e.g., variously-doped silicon) that is generally L shaped or generally mirror L-shaped in at least one straight-line vertical cross section, for example that shown in FIG. 2. In one such embodiment and as shown, transistors 25 may be considered as being arranged as individual pairs of immediately-laterally-adjacent transistors, for example in FIG. 2 the left-two transistors 25 being one pair and the right-two transistors 25 being another pair. One individual of semiconductor material 12 (e.g., a mass thereof) within each pair of immediately-laterally-adjacent transistors is generally L-shaped in the at least one straight-line vertical cross-section, for example the left-illustrated transistor 25 in each pair. The other individual semiconductor material 12 within each pair of immediately-laterally-adjacent transistors 25 is generally mirror L-shaped in the at least one straight-line vertical cross-section, for example each of the right illustrated transistors 25 in each pair. In one embodiment and as shown, the pairs of the immediately-laterally-adjacent transistors 25 are farther laterally apart from one another than are individual transistors 25 within each pair of immediately-laterally-adjacent transistors. For example, and by way of example only, transistors 25 within each pair of such transistors are shown as being laterally apart 14U and the left-pair of transistors 25 is shown as being laterally apart from the right-pair of transistors 25 by 18U. "U" is used for convenience in designating a single "unit" of length, with the numeral prefix there-before indicating the quantity of such units in the depicted example vertical and horizontal directions. The drawings are to scale as respects "U". An example unit "U" is 1 nanometer. Accordingly, 14U in some embodiments may be 14 nanometers and 18U may be 18 nanometers.

Generally L-shaped or generally mirror L-shaped semiconductor material 12 has an elevationally-extending stem 14 having a lateral side 15 and a bottom 16. Semiconductor material 12 also has a base 17 extending horizontally from stem lateral side 15 above stem bottom 16. Semiconductor material 12 of stem 14 comprises an upper source/drain region 18 and a channel region 20 there-below. Transistor 25 comprises at least one of (a) and (b), where (a): the semiconductor material of the stem comprises a lower source/drain region below the channel region, and (b): the semiconductor material of the base comprises a lower source/drain region. FIGS. 1 and 2 show an example embodiment comprising (a), and in one such embodiment as shown comprising only (a) of (a) and (b), specifically with semiconductor material 12 of stem 14 comprising a lower source/drain region 22 below channel region 20.

Figure 4:
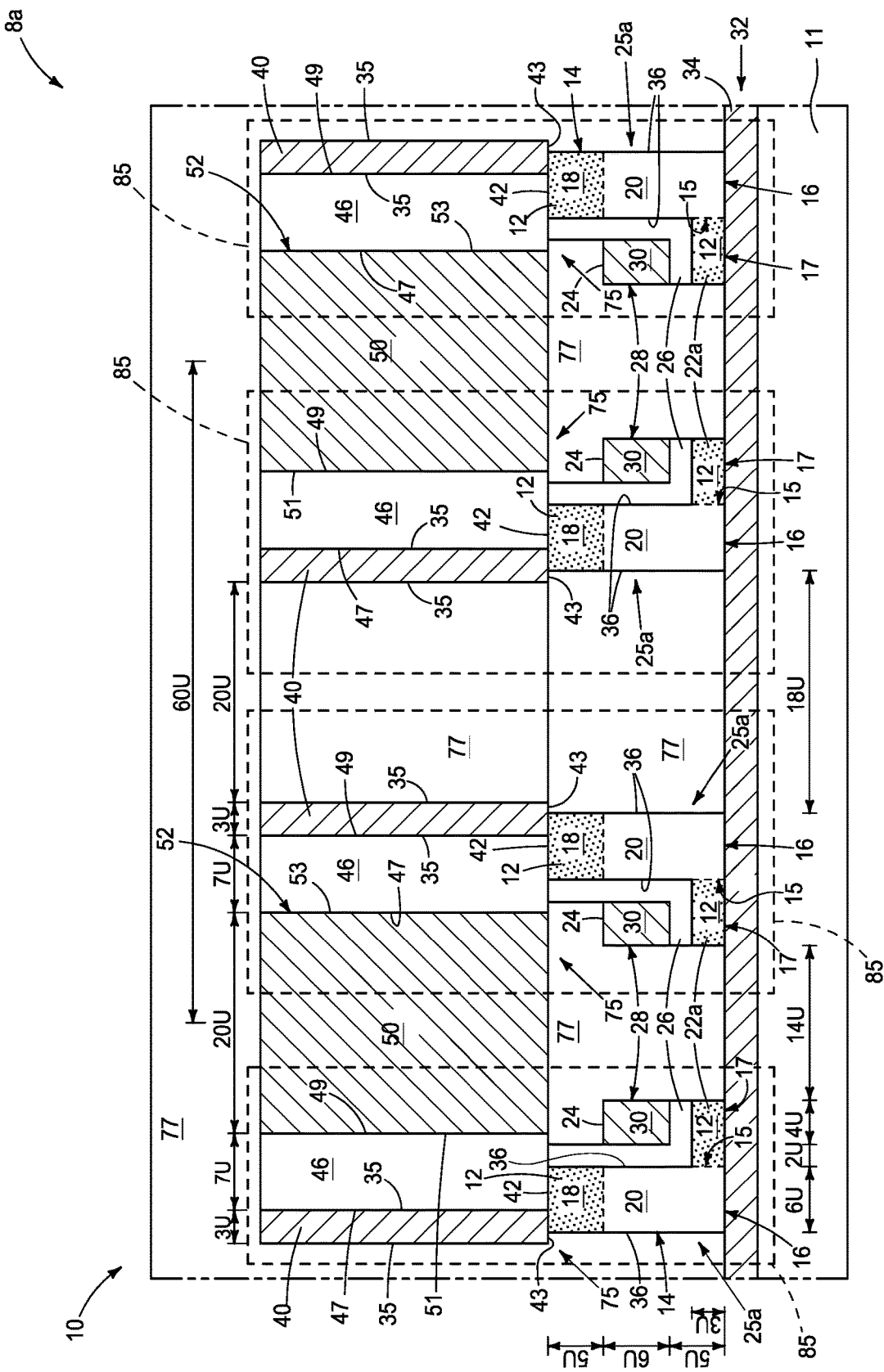
FIG. 4 is a diagrammatic front elevational view of a substrate construction comprising an array of memory cells in accordance with an embodiment of the invention.
Figure 5:
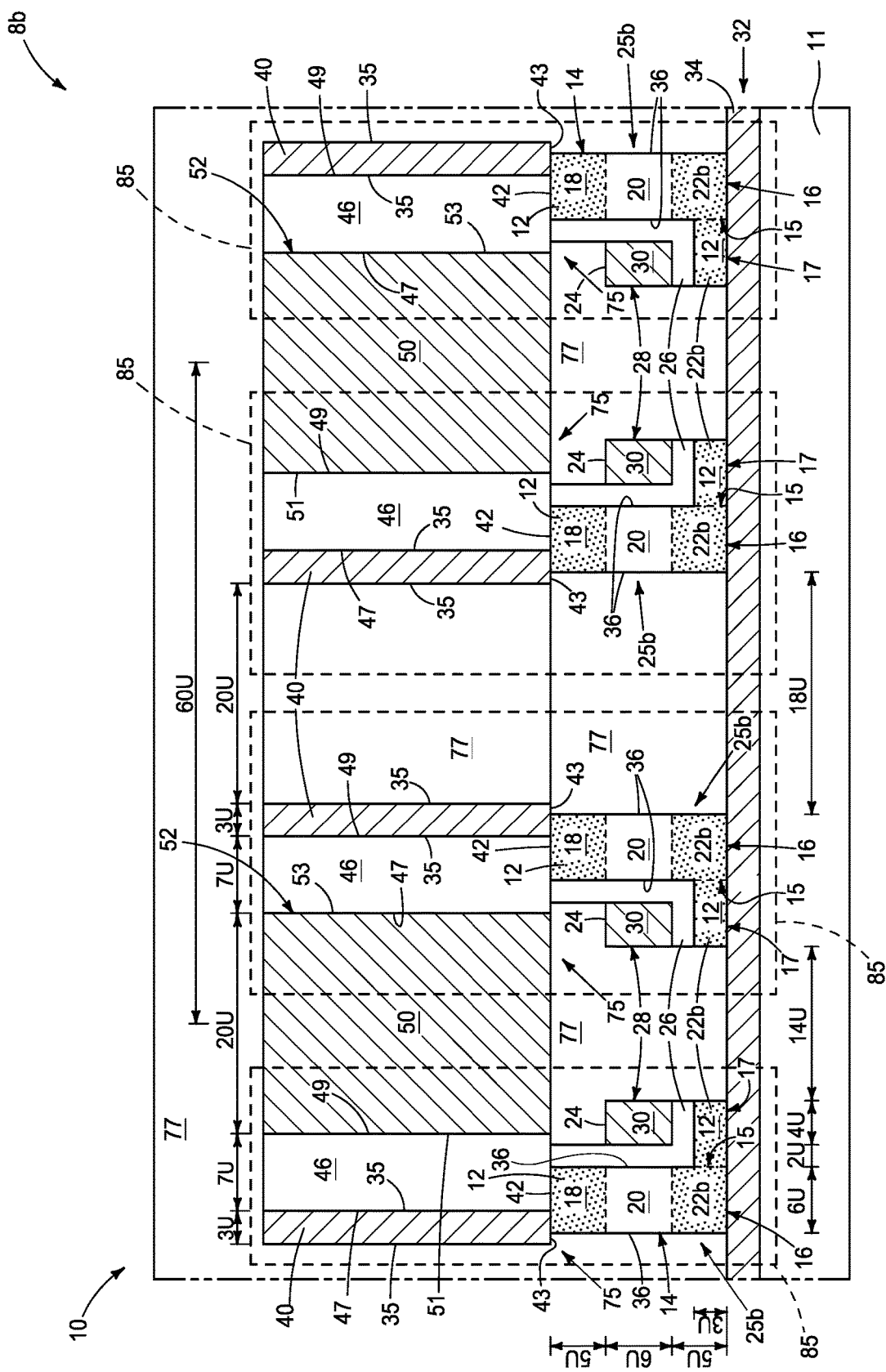
FIG. 5 is a diagrammatic front elevational view of a substrate construction comprising an array of memory cells in accordance with an embodiment of the invention.

An alternate example embodiment construction 8a comprising transistors 25a is shown in FIG. 4. Like numerals from the above-described embodiments have been used where appropriate, with some construction differences being indicated with the suffix "a". Transistor 25a comprises (b), and in one such embodiment as shown comprises only (b) of (a) and (b), specifically with semiconductor material 12 of base 17 comprising lower source/drain region 22a and channel region 20a. FIG. 5 shows another alternate example construction 8b of a transistor 25b. Like numerals from the above-described embodiments have been used where appropriate, with some construction differences being indicated with the suffix "b". FIG. 5 shows an example embodiment wherein lower source/drain region 22b comprises both (a) and (b), specifically wherein semiconductor material 12 of stem 14 and base 17 comprises lower source/drain region 22b.

A gate 24 (e.g., metal material and/or conductively-doped semiconductor material) is operatively laterally adjacent channel region 20 of stem 14, for example having a gate insulator 26 (e.g., comprising, consisting essentially of, or consisting of silicon dioxide, silicon nitride, and/or ferroelectric material) between channel region 20/20a and gate 24.

The upper and lower source/drain regions are shown in the figures with stippling for clarity. Each of source/drain regions 18/22/22a/22b comprises at least a part thereof having a conductivity-increasing dopant therein that is of maximum concentration of such conductivity-increasing dopant within the respective source/drain region, for example to render such part to be conductive (e.g., having a maximum dopant concentration of at least $10^{19}$ atoms/cm$^3$). Accordingly, all or only part of each source/drain region may have such maximum concentration of conductivity-increasing dopant. Source/drain regions 18 and/or 22/22a/ 22b may include other doped regions (not shown), for example halo regions, LDD regions, etc. Channel region 20/20a may be suitably doped with a conductivity-increasing dopant likely of the opposite conductivity-type of the dopant in the source/drain regions, and for example that is at a maximum concentration in the channel region of no greater than $10^{16}$ atoms/cm$^3$. When suitable voltage is applied to gate 24, a conductive channel can form within channel region 20/20a such that current can flow between the upper and lower source/drain regions.

Array 10 comprises rows 28 of wordlines 30 (e.g., metal material and/or conductively-doped semiconductor material) and columns 32 of digitlines 34 (e.g., metal material and/or conductively-doped semiconductor material). Use of "rows" and "columns" herein is with respect to a series of wordlines and a series of digitlines, respectively, and longitudinally along which individual memory cells 85 are received within array 10. The rows may be straight and/or curved and/or parallel and/or non-parallel relative one another, as may be the columns. Further, the rows and columns may intersect relative one another at 90° or at one or more other angles. Individual gates 24 are an individual portion of individual wordlines 30. In one embodiment, pairs of immediately-laterally-adjacent wordlines (e.g., the two left-illustrated wordlines 30 being one pair and the two right-illustrated wordlines 30 being another pair) are farther laterally apart from one another (e.g., 30U) than are individual wordlines 30 within each pair of immediately-laterally-adjacent wordlines 30 (e.g., 14U).

Digitlines 34 of individual columns 32 are under, in one embodiment directly under, channel regions 20/20a of transistors 25/25a/25b of individual memory cells 85 within array 10 and interconnect transistors 25/25a/25b in that column 32. Channel regions 20/20a may be considered as individually having a pair of opposing lateral sides 36. Wordlines 30 are above digitlines 34 in individual rows 28. Wordlines 30 extend laterally across and operatively laterally adjacent one of the pair of laterally-opposing sides 36 of transistor channel regions 20/20a and interconnect transistors 25/25a/25b in that row. In one embodiment and as shown, the other of the pair of laterally-opposing sides 36 of transistor channel regions 20/20a in that row 28 is not operatively laterally adjacent wordline 30 in that row 28 and is not operatively laterally adjacent any other of wordlines 30.

Capacitors 75 of individual memory cells 85 within array 10 individually comprise a first capacitor electrode 40 (e.g., metal material and/or conductively-doped semiconductor material) electrically coupled to, in one embodiment directly electrically coupled to, and extending elevationally upward from an upper source/drain region 18 of one of transistors 25/25a/25b. First capacitor electrode 40 has laterally-opposing sides 35. In one embodiment and as shown, first capacitor electrode 40 is directly against an uppermost surface 42 of upper source/drain region 18, and in one such embodiment is directly against less-than-all of upper source/drain region uppermost surface 42, and in one embodiment as shown is directly against less-than-half of all of upper source/drain region uppermost surface 42. In one embodiment, more-than-half of a lowermost surface 43 of first capacitor electrode 40 is directly against upper source/drain region uppermost surface 42.

Capacitors 75 individually comprise an elevationally-extending capacitor insulator 46 (e.g., comprising, consisting essentially of, or consisting of silicon dioxide, silicon nitride, and/or ferroelectric material) comprising a pair of laterally-opposing sides 47, 49. One of laterally-opposing sides 47, 49 is operatively adjacent, in one embodiment directly against, a lateral side 35 of first capacitor electrode 40. In one such example, at least a majority (in one embodiment all) of the one laterally-opposing side of the capacitor insulator and the lateral side 35 of first capacitor electrode 40 from top to bottom where such are directly against one another are each linearly straight (e.g., and vertical) in horizontal cross-section (e.g., as evident in FIG. 1).

Capacitors 75 individually comprise an elevationally-extending second capacitor electrode 50 comprising a pair of laterally-opposing sides 51, 53. One of laterally-opposing sides 51, 53 of second capacitor electrode 50 is operatively adjacent, in one embodiment directly against, the other laterally-opposing side 47 or 49 of capacitor insulator 46. In one embodiment and as shown, second capacitor electrodes 50 within array 10 are spaced longitudinally-elongated lines 52 extending horizontally along lines 55 of capacitors 75, with individual of second capacitor electrode lines 52 being shared by capacitors 75 longitudinally along that line 55 of capacitors 75. Example dielectric material 77 (FIG. 2; e.g., silicon dioxide and/or silicon nitride) surrounds other components, for example as shown. Dielectric material 77 is not shown in FIGS. 1 and 3 for better clarity of other materials and components.

In one embodiment, second capacitor electrode lines 52 are individually wider than individual wordlines 30, and in one such embodiment are individually more-than-twice as wide, in one such embodiment are at least five times as wide, and in one such embodiment are no more than five times as wide as individual wordlines 30 (e.g., five times being shown as 20U vs. 4U). In one embodiment, second capacitor electrode lines 52 are individually wider than individual digitlines 34, and in one such embodiment are individually less-than-twice as wide as individual digitlines 34 (e.g., 20U vs. 12U).

In one embodiment, wordlines 30 are parallel relative one another, and second capacitor electrode lines 52 are parallel relative one another and relative wordlines 30. In one embodiment, digitlines 34 are parallel relative one another, and second capacitor electrode lines 52 are parallel relative one another and not parallel relative digitlines 34. In one embodiment, first capacitor electrodes 40 individually extend longitudinally along their respective second capacitor electrode line 52 a greater horizontal distance (e.g., 24U) than horizontal distance (e.g., 8U) of space between immediately-longitudinally-adjacent first capacitor electrodes 40 along that line 55 of capacitors 75. In one embodiment, individual pairs of immediately-laterally-adjacent wordlines 30 have at least portions thereof that are directly under individual second capacitor electrode lines 52.

In one embodiment and as shown, memory cells 85 within a tier of memory cells have translational symmetry where individual of memory cells 85 are 1T-1C (i.e., a memory cell having only one transistor and only one capacitor and no other/additional operable electronic component [e.g., no other select device, etc.]) and occupy a horizontal area of about 1.0667 F$^2$, where "F" is memory cell pitch taken horizontally, laterally, and orthogonally through individual second capacitor electrode lines 52, capacitor insulator 46, and first capacitor electrodes 40. In one such embodiment, the horizontal area is bounded by a 1 F by 1.0667 F rectangle 95 (FIG. 2). For example, and by way of example only, such a rectangle may be 32U by 30U as shown. Further, and by way of example only, example vertical and horizontal dimensions of semiconductor material 12, gate insulator 26, wordlines 30, space between wordlines 30, and space between pairs of such wordlines and transistors 25/25a/25b are shown in FIGS. 2, 4 and 5. Further, by way of example only and in one embodiment, example digitline width (e.g., 12U) and space there-between (e.g., 20U) is shown in FIG. 1. Alternate dimensions and spacing(s) may of course be used with, in one ideal embodiment, individual memory cells occupying horizontal area of about 1.0667 $F^2$.

Figure 3:
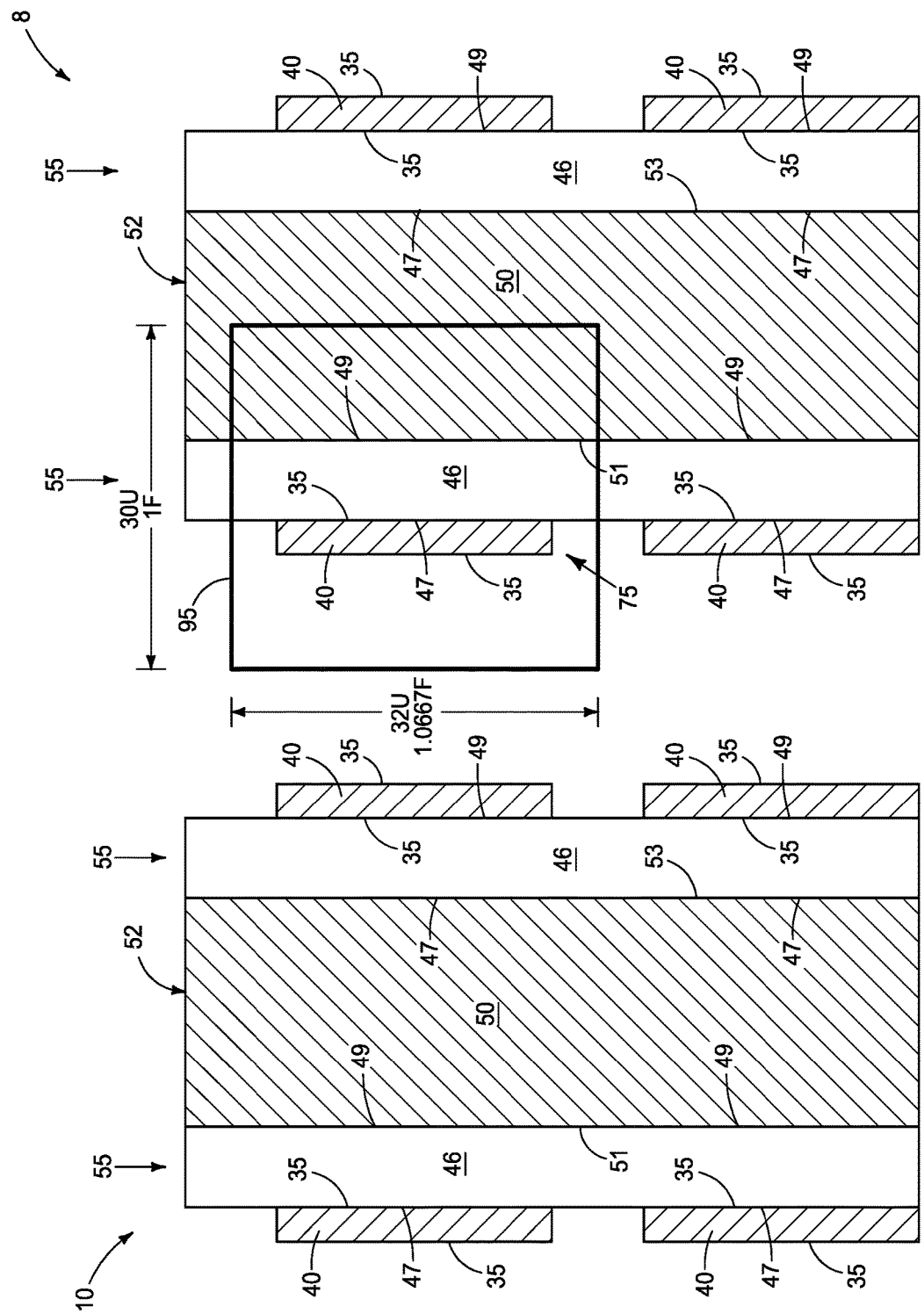
FIG. 3 is a cross-sectional view of part of the FIG. 1 construction, and is taken through line 3-3 in FIG. 1.

Embodiments of the invention include a method of forming an array of transistors, and which is next described with reference to FIGS. 6-13 which show processing with respect to predecessor constructions of that as shown in FIGS. 1-3. Like numerals have been used for predecessor constructions and materials.

Figure 6:
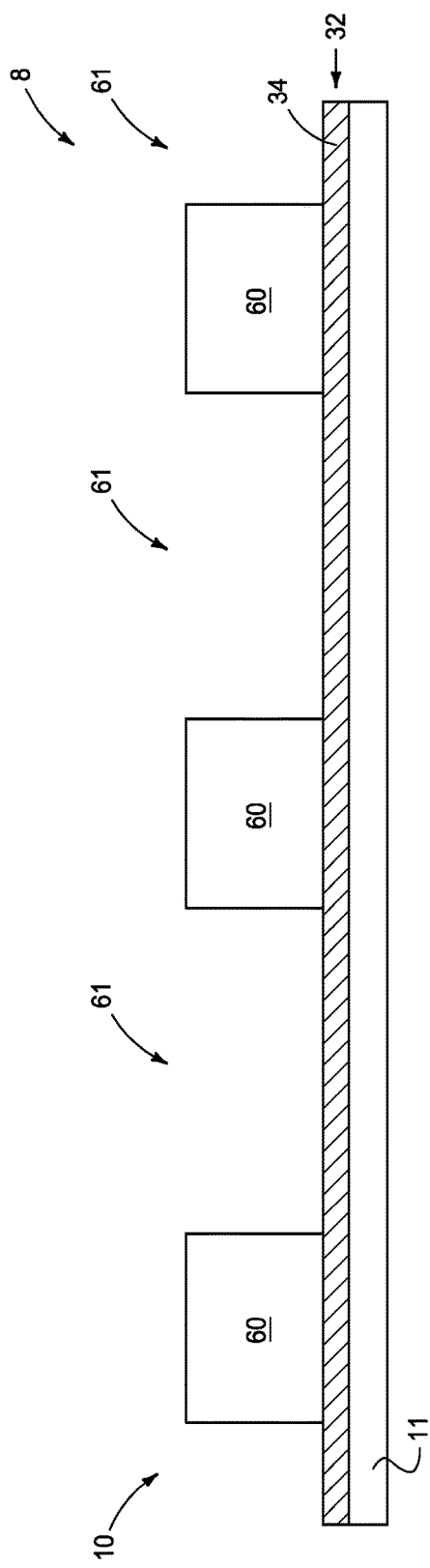
FIG. 6 is a diagrammatic front elevational view of a portion of a predecessor substrate construction to that of FIG. 2 in process in accordance with an embodiment of the invention.
Figure 7:
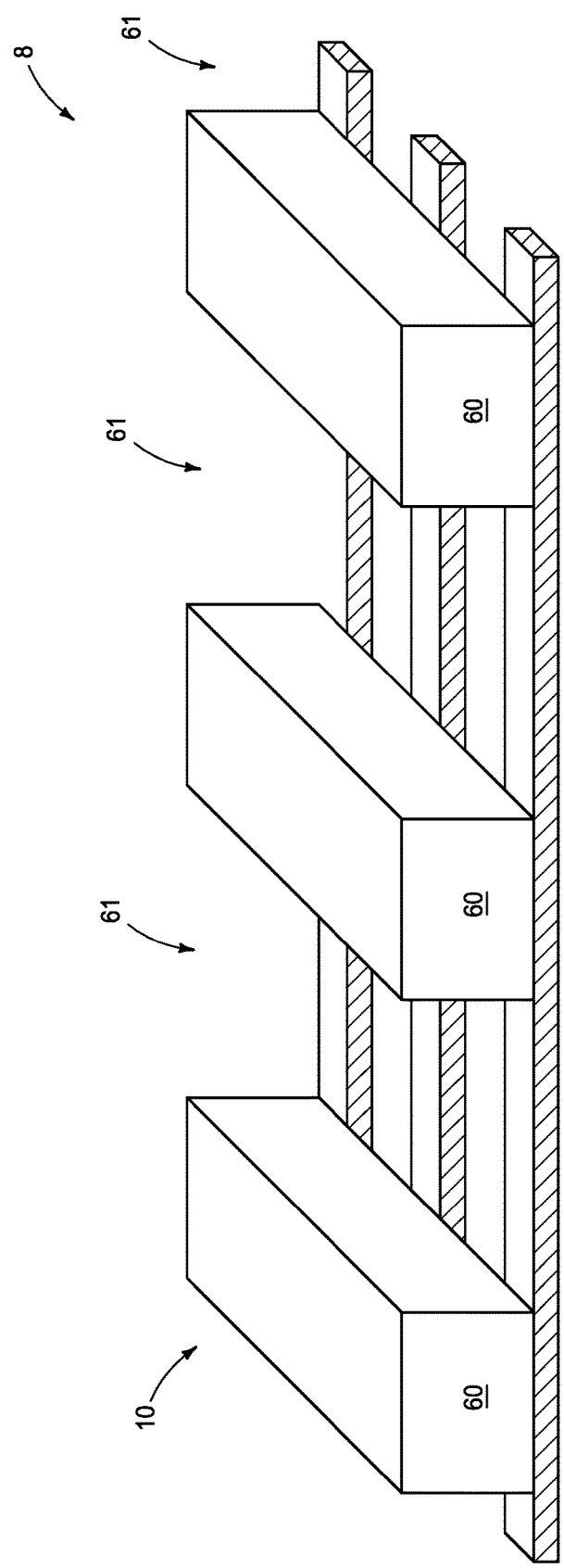
FIG. 7 is a perspective view of the FIG. 6 construction.

Referring to FIGS. 6 and 7 laterally-spaced, elevationally-projecting, and longitudinally-elongated template lines 60 have been formed above substrate 11. Template lines 60 may be partly or wholly sacrificial, or may be non-sacrificial. If non-sacrificial, template lines 60 ideally comprise insulator material (e.g., silicon dioxide). Construction 8 may be considered as comprising void space 61 that is laterally between immediately-laterally-adjacent template lines 60.

Referring to FIG. 8, semiconductor material 12 has been formed along sidewalls of template lines 60 and above substrate 11 that is laterally between template lines 60 to less-than-fill void space 61. Semiconductor material 12 may be etched or polished back after its deposition to reduce its thickness over horizontal surfaces as compared to vertical surfaces. Regardless, insulator material 26 has been formed along sidewalls of semiconductor material 12 and above semiconductor material 12 that is laterally between template lines 60 to less-than-fill remaining volume of void space 61 that is laterally between immediately-laterally-adjacent template lines 60 after forming semiconductor material 12.

Referring to FIG. 9, conductive material 87 has been formed along sidewalls of insulator material 26 and above substrate 11 that is laterally between template lines 60 in void space 61 after forming insulator material 26. In one embodiment and as shown, conductive material 87 is formed to less-than-fill remaining volume of void space 61 that is laterally between template lines 60 after forming insulator material 26.

Referring to FIGS. 9 and 10, a lateral mid-portion 65 of conductive material 87 as shown in FIG. 9 has been removed to form two wordlines 30 there-from that are between immediately-laterally-adjacent template lines 60. In one ideal embodiment, lateral mid-portion 65 of conductive material 87 is removed by maskless anisotropic etching (i.e., being maskless at least within array 10). Example doping for upper source/drain regions 18, channel regions 20, and lower source/drain regions 22 may occur as shown at this point in the processing, prior thereto, and/or subsequently.

Figure 12:
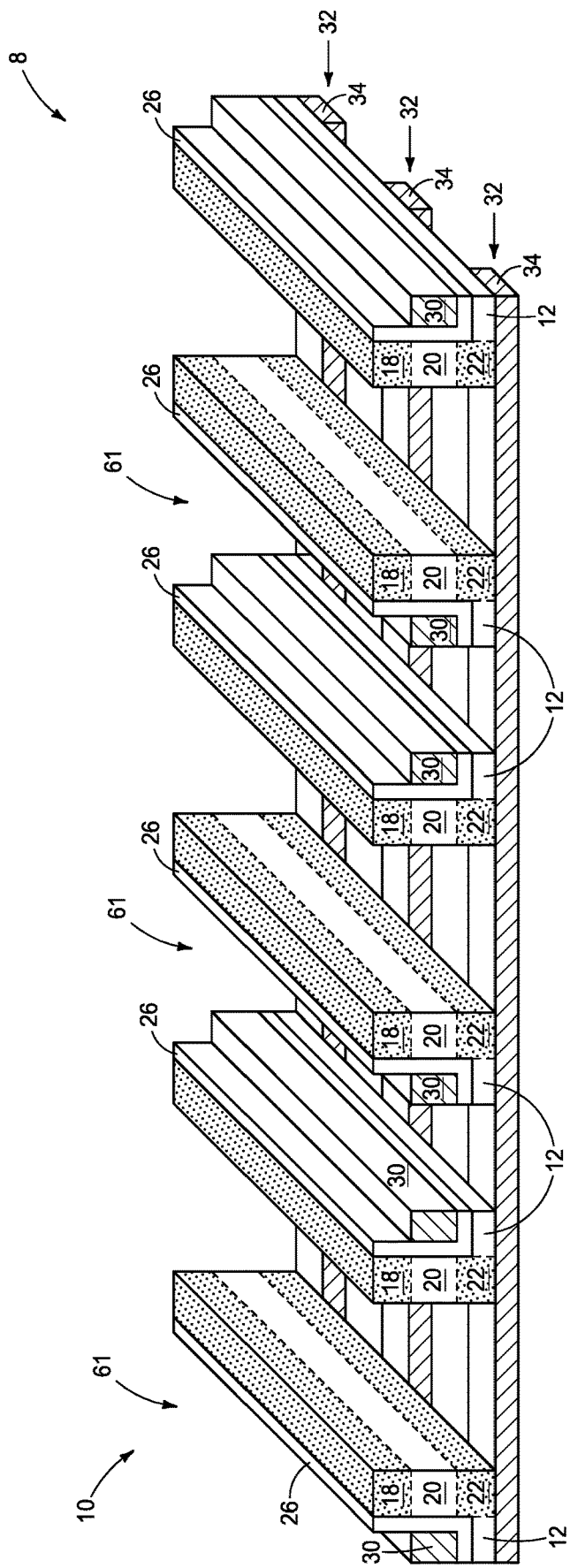
FIG. 12 is a perspective view of the FIG. 11 construction.

FIGS. 11 and 12 show subsequent processing whereby, for example in one embodiment, wordlines 30 have been used as a mask while anisotropically etching through insulator material 26 and semiconductor material 12.

Figure 13:
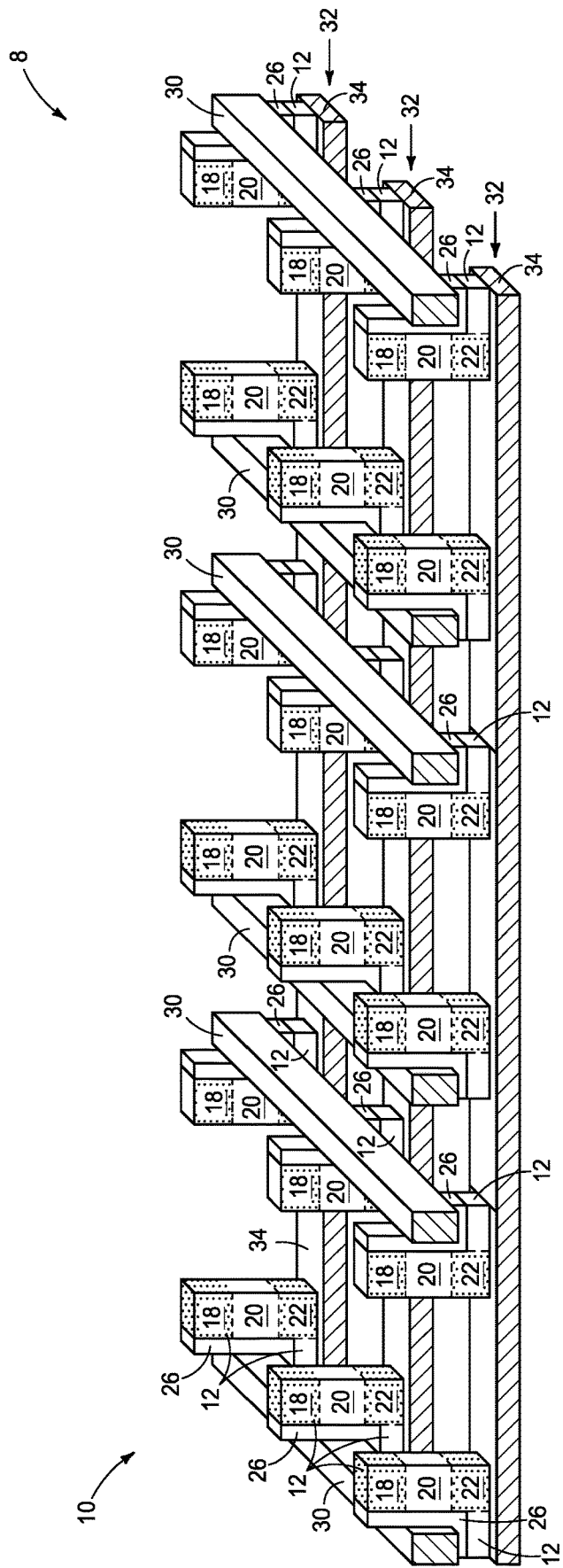
FIG. 13 is a view of the FIG. 12 construction at a processing step subsequent to that shown by FIG. 12.

Referring to FIG. 13 semiconductor material 12 has been patterned (e.g., by photolithographic patterning and etch) to form semiconductor-material masses 12 that are longitudinally-spaced along individual wordlines 30. Example masses 12 are generally L-shaped or generally mirror L-shaped in at least one straight-line vertical cross-section thereby having an elevationally-extending stem 14 (FIG. 2) and a base 17 extending horizontally from a lateral side 15 of stem 14 above a bottom 16 of stem 14. Semiconductor material 12 of stem 14 ultimately comprises an upper source/drain region 18 and a channel region 20 there-below of individual transistors 25. Such transistors 25 comprise at least one of (a) and (b), where (a): the semiconductor material of the stem comprises a lower source/drain region below the channel region of the individual transistors, and (b): the semiconductor material of the base comprises a lower source/drain region of the individual transistors (not shown in FIG. 13, but shown by way of example in FIGS. 4 and 5). Individual wordlines 30 are operatively laterally adjacent channel regions 20 of individual transistors 25 and interconnect transistors 25 along that individual wordline 30.

An example method by which capacitors 75 may be formed is shown and described with reference to FIGS. 14-19. Again, like numerals have been used for predecessor constructions and materials as in the above-described embodiments.

Figure 14:
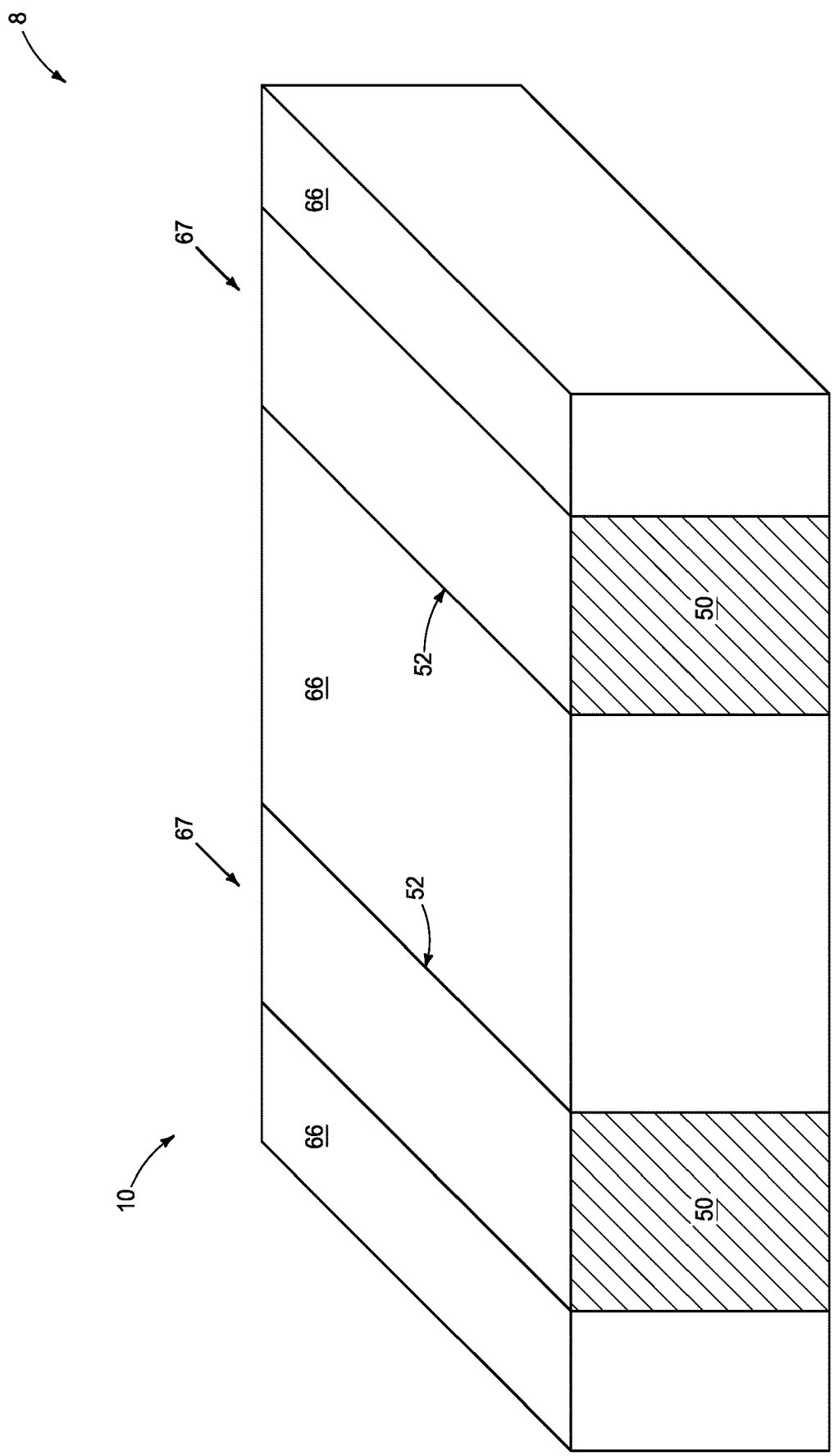
FIG. 14 is a diagrammatic front elevational view of a portion of a predecessor substrate construction to that of FIG. 2 in process in accordance with an embodiment of the invention.

Referring to FIG. 14, a material 66 has been formed above substrate 11 (not shown in FIG. 14). Trenches 67 have been formed in material 66 corresponding to longitudinal outline and shape of second capacitor electrode lines 52, and trenches 67 have been filled with suitable conductive material as shown to so-form lines 52. Such may occur, for example, by deposition of such conductive material and planarizing such back at least to the elevationally-outermost surfaces of material 66. Material 66 may be entirely sacrificial, and accordingly may comprise any of conductive, semiconductive, and insulator materials. One example is silicon dioxide. Substrate material below conductive material of second capacitor electrode lines 52 and material 66 is not shown, but may for example appear as showing in FIG. 13.

Referring to FIG. 15, material 66 (not shown) has been removed selectively relative to the depicted conductive material of second capacitor electrode lines 52.

Figure 16:
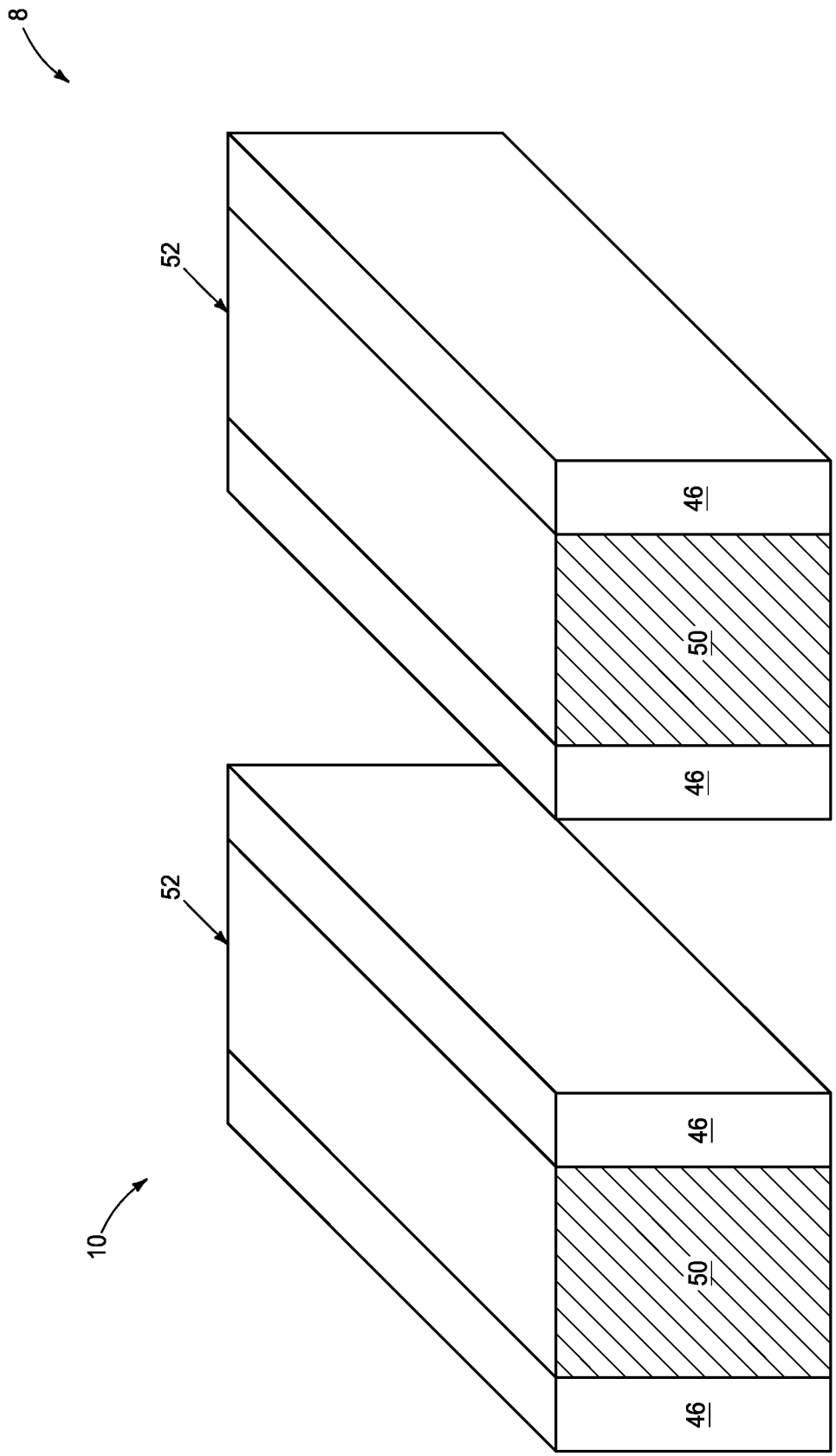
FIG. 16 is a view of the FIG. 15 construction at a processing step subsequent to that shown by FIG. 15.

Referring to FIG. 16 capacitor insulator 46 has been deposited and etched-back (e.g., by anisotropic etching that is maskless at least within array area 10).

Figure 17:
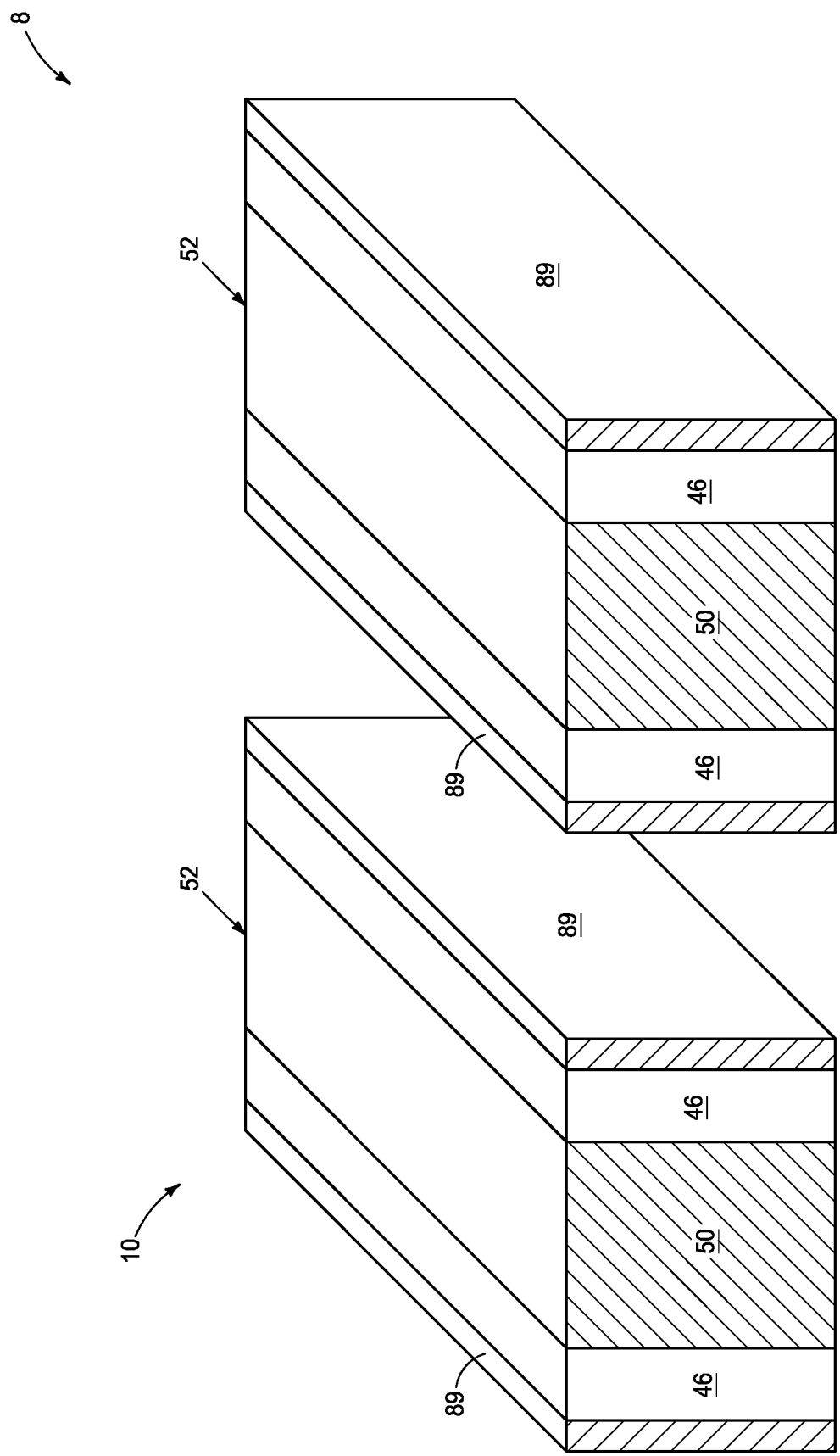
FIG. 17 is a view of the FIG. 16 construction at a processing step subsequent to that shown by FIG. 16.

Referring to FIG. 17, conductive material 89 has been deposited along sidewalls of capacitor insulator 46. Such has subsequently been etched-back to remove such from largely being over horizontal surfaces, for example by anisotropic spacer-like etching of material 46 within array area 10 (e.g., by anisotropic etching that is maskless at least within array area 10).

Figure 18:
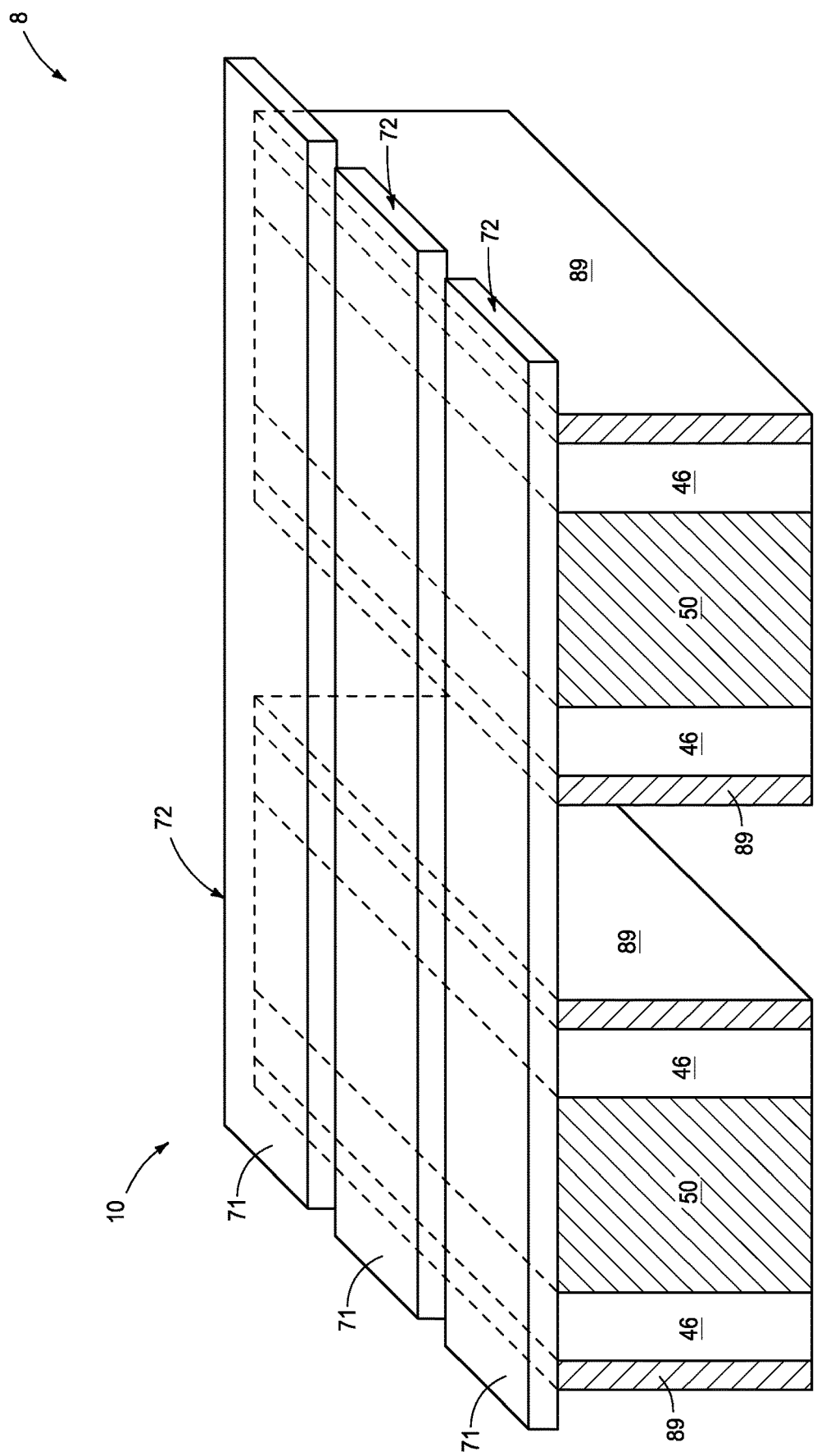
FIG. 18 is a view of the FIG. 17 construction at a processing step subsequent to that shown by FIG. 17.

Referring to FIG. 18, a masking material 71 has been deposited and patterned into lines 72.

Figure 19:
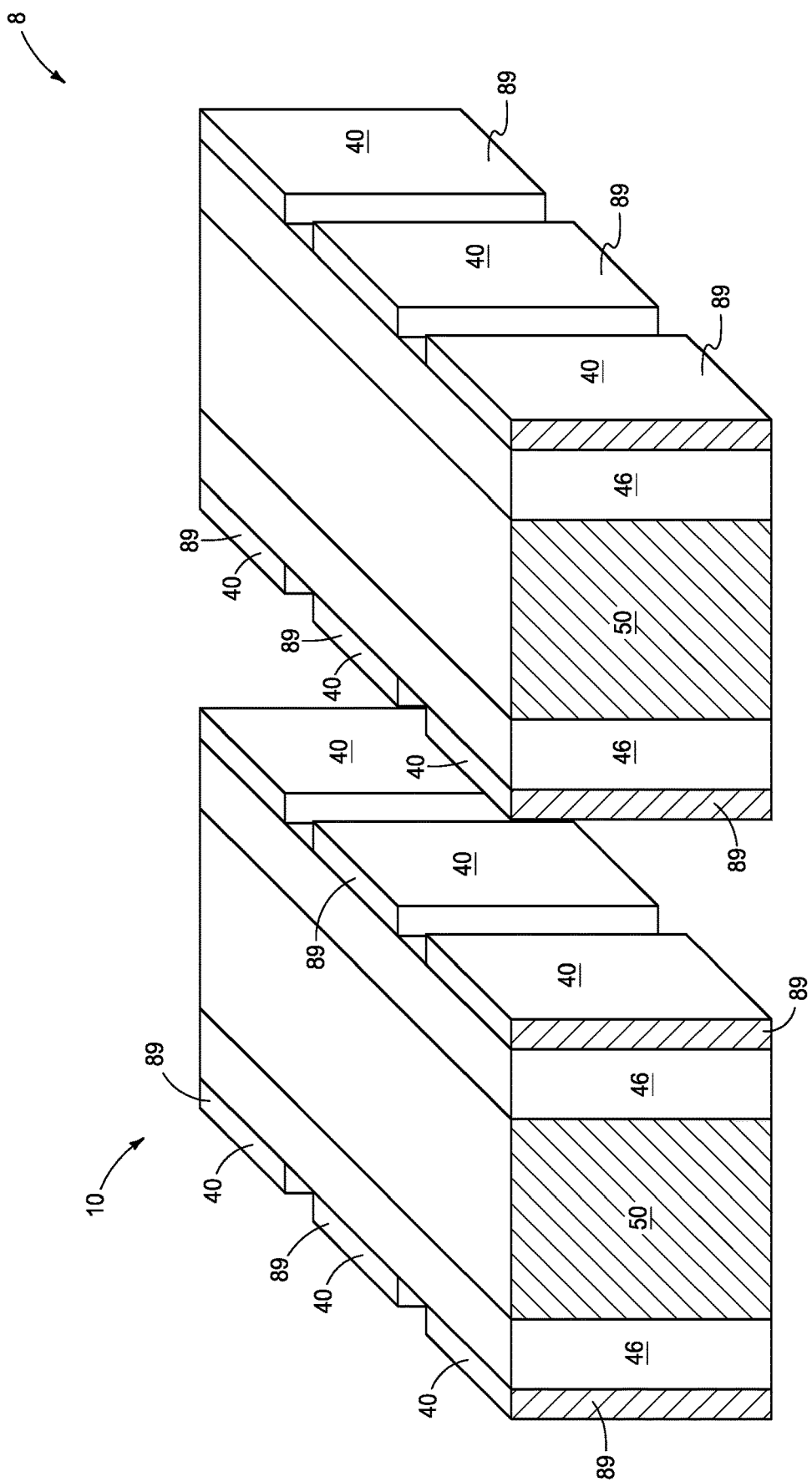
FIG. 19 is a view of the FIG. 18 construction at a processing step subsequent to that shown by FIG. 18.

Referring to FIG. 19, lines 72 (not shown) have been used as a mask while anisotropically etching conductive material 89 to form first capacitor electrodes 40 as shown, for example to produce the upper portion of the structure as shown in FIG. 1. Lines 72 (not shown) have been removed in FIG. 19.

Any attribute(s) or aspect(s) as shown and/or described herein with respect to structure embodiments may be used in method embodiments and vice versa. Pitch multiplication principles may be used in method aspects of the invention (e.g., features may be formed along a sidewall of another feature to have lateral thickness that is less than lateral thickness of the other feature regardless of how such other feature was formed).

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, an array of memory cells individually comprising a capacitor and an elevationally-extending transistor, where the array comprises rows of wordlines and columns of digitlines, comprises individual of the columns comprising a digitline under channel regions of elevationally-extending transistors of individual memory cells within the array and interconnecting the transistors in that column. The channel regions individually comprise a pair of opposing lateral sides. Individual of the rows comprise a wordline above the digitlines. The wordline extends laterally across and operatively laterally adjacent one of the pair of laterally-opposing sides of the transistor channel regions and interconnects the transistors in that row. The other of the pair of laterally-opposing sides of the transistor channel regions in that row is not operatively laterally adjacent the wordline in that row and is not operatively laterally adjacent any other of the wordlines. Capacitors of the individual memory cells within the array individually comprise a first capacitor electrode electrically coupled to and extending elevationally upward from an upper source/drain region of one of the transistors. An elevationally-extending capacitor insulator comprises a pair of laterally-opposing sides, one of which is operatively adjacent a lateral side of the first capacitor electrode. An elevationally-extending second capacitor electrode comprises a pair of laterally-opposing sides, one of which is operatively adjacent the other laterally-opposing side of the capacitor insulator. The second capacitor electrodes within the array are spaced longitudinally-elongated lines extending horizontally along lines of the capacitors. Individual of the second capacitor electrode lines are shared by capacitors longitudinally along that line of capacitors.

In some embodiments, an array of memory cells individually comprising a capacitor and an elevationally-extending transistor, with the array comprising rows of wordlines and columns of digitlines, comprises individual of the columns comprise a digitline under channel regions of elevationally-extending transistors of individual memory cells within the array and interconnect the transistors in that column. The channel regions individually comprise a pair of opposing lateral sides. An individual of the rows comprises a wordline above the digitlines. The wordline extends laterally across and operatively laterally adjacent one of the pair of laterally-opposing sides of the transistor channel regions and interconnects the transistors in that row. The other of the pair of laterally-opposing sides of the transistor channel regions in that row is not operatively laterally adjacent the wordline in that row and is not operatively laterally adjacent any other of the wordlines. Capacitors of the individual memory cells within the array individually comprise a first capacitor electrode directly against and extending elevationally upward from an uppermost surface of an upper source/drain region of one of the transistors. The first capacitor electrode is directly against less-than-all of the uppermost surface of the upper source/drain region. An elevationally-extending capacitor insulator comprises a pair of laterally-opposing sides, one of which is operatively adjacent a lateral side of the first capacitor electrode. An elevationally-extending second capacitor electrode comprises a pair of laterally-opposing sides, one of which is operatively adjacent the other laterally-opposing side of the capacitor insulator.

In some embodiments, an array of memory cells individually comprising a capacitor and an elevationally-extending transistor, with the array comprising rows of wordlines and columns of digitlines, comprises individual of the columns comprises a digitline under channel regions of elevationally-extending transistors of individual memory cells within the array and interconnect the transistors in that column. Individual of the rows comprise a wordline above the digitlines. The wordline extends laterally across and operatively laterally adjacent a lateral side of the transistor channel regions and interconnects the transistors in that row. Capacitors of the individual memory cells within the array individually comprise a first capacitor electrode electrically coupled to and extending elevationally upward from an upper source/drain region of one of the transistor. An elevationally-extending capacitor insulator comprises a pair of laterally-opposing sides, one of which is operatively adjacent a lateral side of the first capacitor electrode. An elevationally-extending second capacitor electrode comprises a pair of laterally-opposing sides. One of the laterally-opposing sides of the second capacitor electrode is operatively adjacent the other laterally-opposing side of the capacitor insulator. The second capacitor electrodes within the array are spaced longitudinally-elongated lines extending horizontally along lines of the capacitors. Individual of the second capacitor electrode lines are shared by capacitors longitudinally along that line of capacitors. Individual pairs of immediately-laterally-adjacent of the wordlines have at least portions thereof that are directly under the individual second capacitor electrode lines.

In some embodiments, a transistor comprises semiconductor material that is generally L-shaped or generally mirror L-shaped in at least one straight-line vertical cross-section thereby having an elevationally-extending stem and a base extending horizontally from a lateral side of the stem above a bottom of the stem. The semiconductor material of the stem comprises an upper source/drain region and a channel region there-below. The transistor comprises at least one of (a) and (b), where (a): the semiconductor material of the stem comprises a lower source/drain region below the channel region, and (b): the semiconductor material of the base comprises a lower source/drain region. A gate is operatively laterally adjacent the channel region of the stem.

In some embodiments, a method of forming an array of transistors comprises forming laterally-spaced, elevationally-projecting, and longitudinally-elongated template lines above a substrate. Semiconductor material is formed along sidewalls of the template lines and above the substrate that is laterally between the template lines to less-than-fill void space that is laterally between immediately-laterally-adjacent of the template lines. An insulator material is formed along sidewalls of the semiconductor material and above the semiconductor material that is laterally between the template lines to less-than-fill remaining volume of the void space that is laterally between the immediately-laterally-adjacent template lines after forming the semiconductor material. Conductive material is formed along sidewalls of the insulator material and above the insulator material that is laterally between the template lines in the void space that is laterally between the immediately-laterally-adjacent template lines after forming the insulator material. A lateral mid-portion of the conductive material is removed to form two wordlines there-from that are between the immediately-laterally-adjacent template lines. The semiconductor material is patterned to form semiconductor-material masses that are longitudinally-spaced along individual of the wordlines. The masses are generally L-shaped or generally mirror L-shaped in at least one straight-line vertical cross-section thereby having an elevationally-extending stem and a base extending horizontally from a lateral side of the stem above a bottom of the stem. The semiconductor material of the stem ultimately comprises an upper source/drain region and a channel region there-below of individual transistors. The transistors comprise at least one of (a) and (b), where (a): the semiconductor material of the stem comprises a lower source/drain region below the channel region of the individual transistors, and (b): the semiconductor material of the base comprises a lower source/drain region of the individual transistors. The individual wordlines are operatively laterally adjacent the channel regions of the individual transistors and interconnect the transistors along that individual wordline.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A transistor comprising:
   semiconductor material that is generally L-shaped or generally mirror L-shaped in at least one straight-line vertical cross-section thereby having an elevationally-extending stem and a base extending horizontally from a lateral side of the stem above a bottom of the stem, the semiconductor material of the stem comprising an upper source/drain region and a channel region there-below;
   only (b) of (a) and (b), where
   (a): the semiconductor material of the stem comprises a lower source/drain region below the channel region; and
   (b): the semiconductor material of the base comprises a lower source/drain region; and
   a gate operatively laterally adjacent the channel region of the stem.

2. An array of said transistors of claim 1 wherein individual of said gates are an individual portion of individual wordlines that interconnect individual of the transistors along that individual wordline.

3. The array of claim 2 comprising individual pairs of immediately-laterally-adjacent transistors, one individual of the semiconductor material within each pair of the immediately-laterally-adjacent transistors being generally L-shaped in the at least one straight-line vertical cross-section, the other individual semiconductor material within each pair of the immediately-laterally-adjacent transistors being generally mirror L-shaped in the at least one straight-line vertical cross-section.

4. The array of claim 2 wherein the wordlines are parallel relative one another.

5. The transistor of claim 1 wherein the semiconductor material is generally L-shaped in the at least one straight-line vertical cross-section.

6. The transistor of claim 1 wherein the semiconductor material is generally mirror L-shaped in the at least one straight-line vertical cross-section.

7. The transistor of claim 1 comprising a gate insulator that is generally L-shaped or generally mirror L-shaped in the at least one straight-line vertical cross-section.

8. The transistor of claim 7 wherein the gate insulator is generally L-shaped in the at least one straight-line vertical cross-section.

9. The transistor of claim 7 wherein the gate insulator is generally mirror L-shaped in the at least one straight-line vertical cross-section.

10. The transistor of claim 1 wherein the upper source/drain region and the lower source/drain region have different vertical thickness relative one another.

11. The transistor of claim 10 wherein the upper source/drain region is vertically thicker than the lower source/drain region.

12. The transistor of claim 1 wherein at least one of the stem and the base have a bottom surface that is planar.

13. The transistor of claim 12 wherein each of the stem and the base have a bottom surface that is planar.

14. The transistor of claim 13 wherein the stem and the base bottom surfaces are coplanar.

15. The transistor of claim 1 wherein at least one of the stem and the base is directly against a conductive line that is directly there-below.

16. The transistor of claim 15 wherein each of the stem and the base is directly against a conductive line that is directly there-below.

17. The transistor of claim 1 wherein the lower source/drain region and the channel region have different vertical thickness relative one another.

18. The transistor of claim 17 wherein the channel region is vertically thicker than the lower source/drain region.

19. The transistor of claim 1 wherein the lower source/drain region is horizontally wider than the gate.

20. A method of forming an array of transistors, comprising:

forming laterally-spaced, elevationally-projecting, and longitudinally-elongated template lines above a substrate;

forming semiconductor material along sidewalls of the template lines and above the substrate that is laterally between the template lines to less-than-fill void space that is laterally between immediately-laterally-adjacent of the template lines;

forming an insulator material along sidewalls of the semiconductor material and above the semiconductor material that is laterally between the template lines to less-than-fill remaining volume of the void space that is laterally between the immediately-laterally-adjacent template lines after forming the semiconductor material;

forming conductive material along sidewalls of the insulator material and above the insulator material that is laterally between the template lines in the void space that is laterally between the immediately-laterally-adjacent template lines after forming the insulator material;

removing a lateral mid-portion of the conductive material to form two wordlines there-from that are between the immediately-laterally-adjacent template lines; and patterning the semiconductor material to form semiconductor-material masses that are longitudinally-spaced along individual of the wordlines, the masses being generally L-shaped or generally mirror L-shaped in at least one straight-line vertical cross-section thereby having an elevationally-extending stem and a base extending horizontally from a lateral side of the stem above a bottom of the stem, the semiconductor material of the stem ultimately comprising an upper source/drain region and a channel region there-below of individual transistors;

at least one of (a) and (b), where
(a): the semiconductor material of the stem comprises a lower source/drain region below the channel region of the individual transistors; and
(b): the semiconductor material of the base comprises a lower source/drain region of the individual transistors; and the individual wordlines being operatively laterally adjacent the channel regions of the individual transistors and interconnecting the transistors along that individual wordline.

* * * * *